(12) United States Patent
Ding et al.

(10) Patent No.: US 9,704,948 B2
(45) Date of Patent: Jul. 11, 2017

(54) POWER TRENCH MOSFET WITH IMPROVED UNCLAMPED INDUCTIVE SWITCHING (UIS) PERFORMANCE AND PREPARATION METHOD THEREOF

(71) Applicant: Alpha and Omega Semiconductor Incorporated, Sunnyvale, CA (US)

(72) Inventors: Yongping Ding, San Jose, CA (US); Hamza Yilmaz, Saratoga, CA (US); Xiaobin Wang, San Jose, CA (US); Madhur Bobde, Sunnyvale, CA (US)

(73) Assignee: Alpha & Omega Semiconductor (Cayman), Ltd., Sunnyvale, CA (US)

( * ) Notice: Subject to any disclaimer, the term of this patent is extended or adjusted under 35 U.S.C. 154(b) by 0 days.

(21) Appl. No.: 14/455,877

(22) Filed: Aug. 9, 2014

(65) Prior Publication Data
US 2016/0043168 A1  Feb. 11, 2016

(51) Int. Cl.

| | |
|---|---|
| *H01L 29/06* | (2006.01) |
| *H01L 29/78* | (2006.01) |
| *H01L 29/73* | (2006.01) |
| *H01L 29/66* | (2006.01) |
| *H01L 29/423* | (2006.01) |
| *H01L 29/40* | (2006.01) |
| *H01L 21/311* | (2006.01) |

(52) U.S. Cl.
CPC .... *H01L 29/0626* (2013.01); *H01L 21/31144* (2013.01); *H01L 29/402* (2013.01); *H01L 29/407* (2013.01); *H01L 29/4236* (2013.01); *H01L 29/66734* (2013.01); *H01L 29/7811* (2013.01); *H01L 29/7813* (2013.01)

(58) Field of Classification Search
CPC ............ H01L 29/0626; H01L 29/7813; H01L 29/7811; H01L 29/7886; H01L 29/7313; H01L 29/66734; H01L 29/4236; H01L 29/407; H01L 29/402; H01L 26/1095
See application file for complete search history.

(56) References Cited

U.S. PATENT DOCUMENTS

2012/0146090 A1* 6/2012 Lui .................... H01L 29/8613
257/139

* cited by examiner

*Primary Examiner* — Thanhha Pham
(74) *Attorney, Agent, or Firm* — Lance A. Li; Chein-Hwa Tsao; 5Suns

(57) ABSTRACT

A trench type power semiconductor device with improved breakdown voltage and UIS performance and a method for preparation the device are disclosed. The trench type power semiconductor device includes a first contact hole formed in a mesa in the active area and a second contact hole formed in a mesa in an active to termination intermediate area, where the first contact hole is deeper and wider than the second contact hole.

15 Claims, 7 Drawing Sheets

POWER TRENCH MOSFET WITH IMPROVED UNCLAMPED INDUCTIVE SWITCHING (UIS) PERFORMANCE AND PREPARATION METHOD THEREOF

FIELD OF PRESENT INVENTION

The present invention relates to a Metal-Oxide-Semiconductor Field Effect Transistor (MOSFET) for power switching, in particular, to a power trench MOSFET with an improved unclamped inductive switching (UIS) performance to optimize an avalanche breakdown voltage (BV) of the power trench MOSFET and a preparation method thereof.

BACKGROUND OF THE INVENTION

In a power semiconductor device, a gate may be formed in a trench extending downward from the surface of a semiconductor silicon substrate, for example, a trench MOSFET a trench insulated gate bipolar transistor (IGBT) and the likes, which include various types of trench gates with different functions, but due to characteristics of the device structure itself, electric field intensity at the bottom of some trenches is at a highest level. When the voltage climbs to the avalanche breakdown point, impact ionization occurs at the corner of the trench resulting in the avalanche current. In general, the avalanche breakdown causes a hot carrier effect. When the breakdown occurs close to a gate oxide layer, an undesirable consequence is that the hot carrier may be captured and injected into the gate oxide layer, which may damage or break off the gate oxide layer, causing a long-term reliability problem of the power device. In addition, such trench often limits the device to achieve the high breakdown voltage.

In general, if the avalanche breakdown occurs during the low current levels, the performance of the device may not be significantly hampered when the breakdown occurs in a termination area, and there is no concern about the safety operation issues of the device. However, in some special operating periods, such as during an unclamped inductive switching (UIS) period, as the inductive current in a circuit system does not change suddenly, the device often bears certain higher voltage intensity, equivalently, when the device is in a high current avalanche breakdown stage the termination area with very limited surface area may not be able to handle the power loss safely and effectively because the active area of the power device cannot be reduced to increase the termination area, resulting the breakdown in the termination area becoming a negative effect on the safe operation area (SOA) of the device, which is undesirable. Particularly when the trench depth in the active area and the trench depth in the termination area is inconsistent, the terminal area will breakdown at a low voltage level.

In view of the prior art's problems, it is necessary to keep the device in the SOA at an optimal UIS condition to optimize the distribution of the electric field intensity of the power semiconductor device It is within this context that embodiments of the present invention arise.

BRIEF DESCRIPTION OF THE DRAWINGS

Objects and advantages of the invention will become apparent upon reading the following detailed description and upon reference to the accompanying drawings. However, the accompanying drawings are for illustration and explanation only and do not limit the scope of the invention.

DETAILED DESCRIPTION OF THE SPECIFIC EMBODIMENTS

Figure 1:
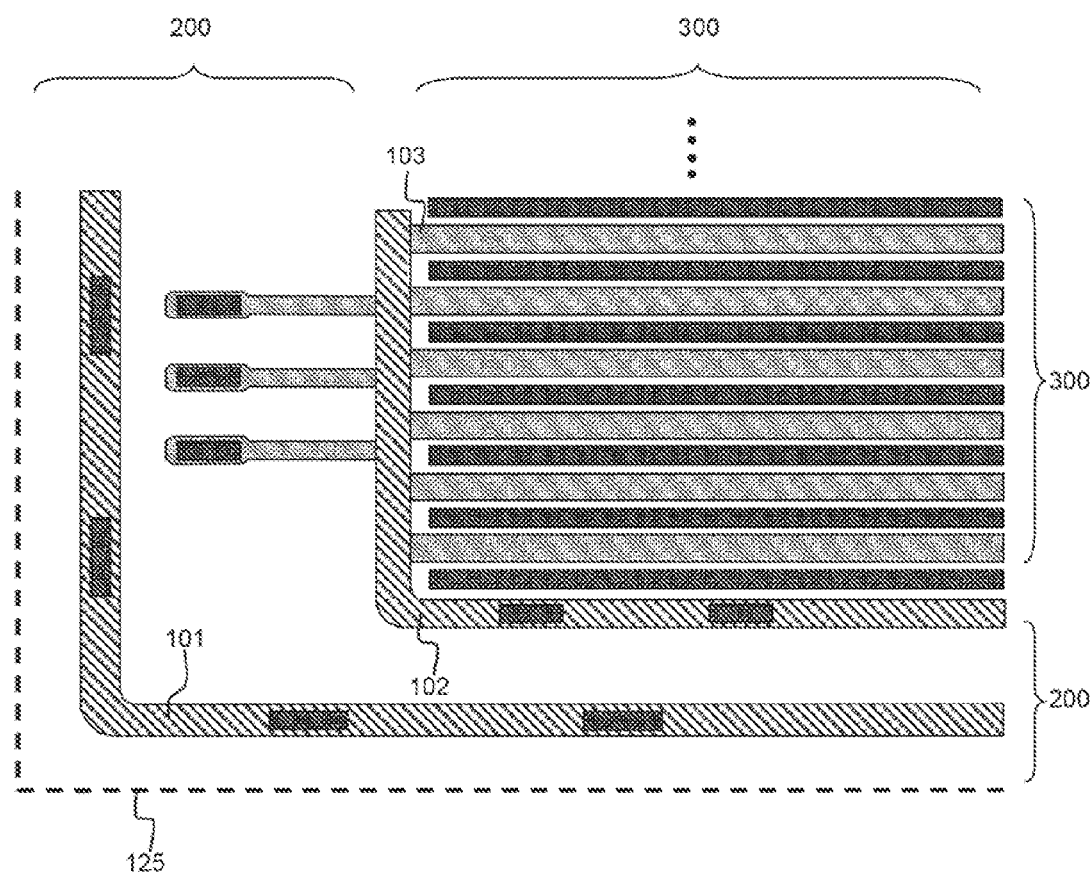
FIG. 1 is a top view of a portion of a trench type MOSFET device including a termination trench, an isolation trench and the active trenches.
Figure 2A:
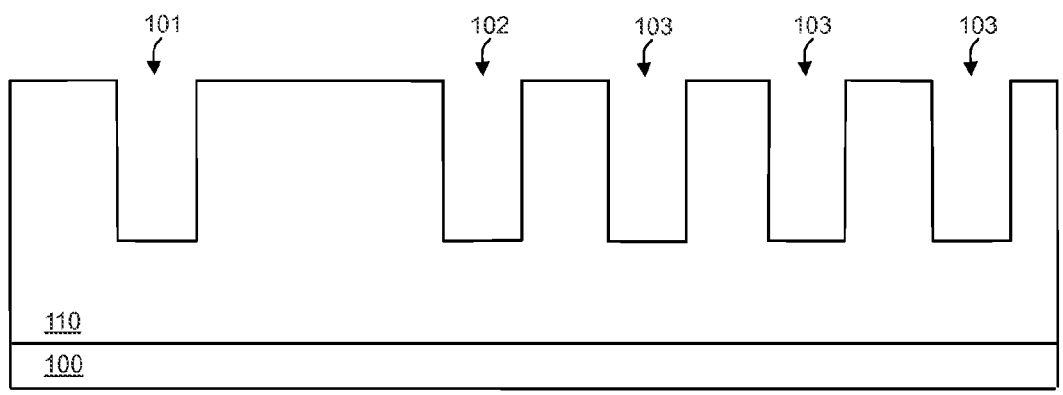
FIG. 2A to FIG. 2J are cross-sectional diagrams illustrating a method for preparing a trench type MOSFET device.

In FIG. 2A, a semiconductor substrate in a trench power MOSFET device comprises a heavily doped bottom substrate 100 of a first conductivity type and an epitaxial layer 110 having the same conductivity type but lower doping concentration than the bottom substrate 100, or example, N+ bottom substrate 100 and the N– epitaxial layer 110. The epitaxial layer 110 is etched through a trench mask (not shown) to form a termination trench 101, an isolation trench 102 and a plurality of active trenches 103 respectively, which extend downward from the top surface of the epitaxial layer 110 with the bottom of each trench ending inside the epitaxial layer 110. A top view illustrating the layout of the trenches on the semiconductor substrate of an individual semiconductor chip is shown in FIG. 1. Moreover, the plurality of active trenches 103 is formed in an active area 300 surrounding by the isolation trench 102. The termination trench 101 is formed in the a termination area 200 formed outside the isolation trench 102 and surrounding the isolation trench 102 close to the edge 125 of the chip.

Figure 2B:
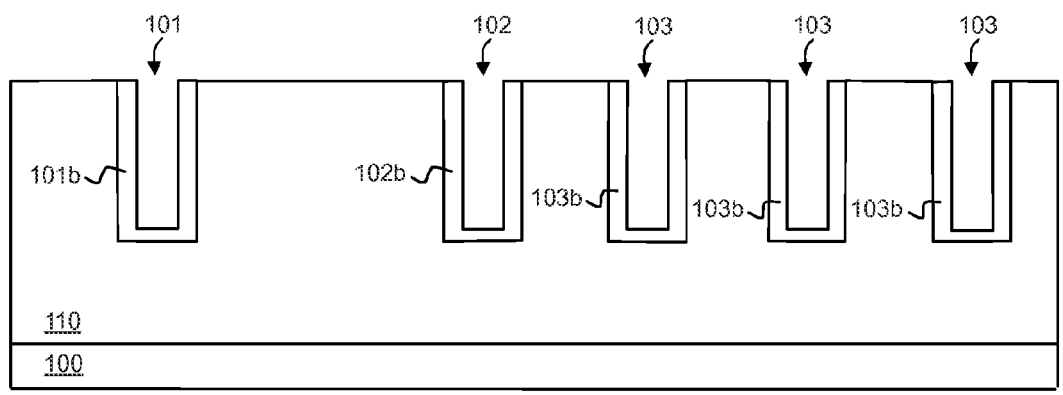
Figure 2C:
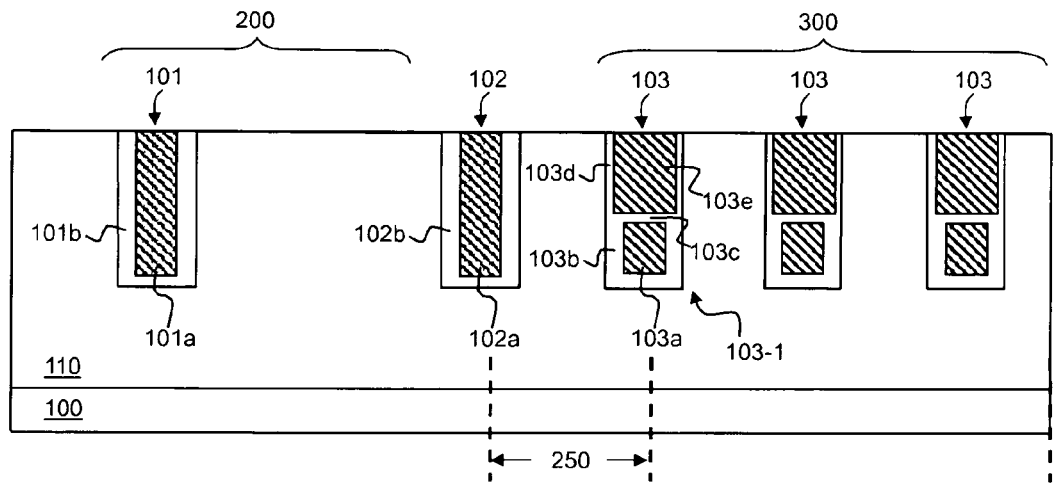

In FIG. 2B, firstly, an insulation layer 101b is formed at the side wall and the bottom of the termination trench 101 respectively, an insulation layer 102b is formed at the side wall and the bottom of the isolation trench 102 respectively, and an insulation layer 103b is formed at the side wall and the bottom of each active trench 103 respectively. The insulation layers 101b, 102b and 103b may be silicon dioxide layers grown through a thermal oxidation process. In FIG. 2C, a conductive material is filled in each trench for example, doped polysilicon is filled in the termination trench 101, the isolation trench 102 and the active trenches 103. As shown in FIG. 2C, the conductive material at the upper part of each active trench 103 is removed, thus the remained lower part of each active channel 103 forms a shielding electrode 103a, followed by a low pressure chemical vapor deposition (LPCVD) or plasma enhanced chemical vapor deposition (PECVD) process to form an insulation material, such as SiO2, that fills in the upper part of the active trench 103 atop the shielding electrode 103a. The insulation material and the insulation layer 103b on the side wall at the upper part of the active trench 103 are removed forming the insulation layer 103c above the shielding electrode 103a. A gate oxide layer 103d, such as SiO2, is formed on the side wall at the upper part of the active trench 103, then a conductive material is filled in the space at the upper part of each active trench 103 forming a control gate 103e. The gate oxide layer 103d is thinner than the insulation layer 103b formed on the side wall at the lower part of the active trench 103 in the active trench 103. The control gate 103e is isolated from the shielding electrode 103a by the insulation layer 103c between them. It is well known in the art, in a Shield Gate Trench (SGT) MOSFET, the shielding electrode 103a is coupled to a source electrode of the MOSFET at the source potential, and thus parasitic capacitance $C_{gd}$ between the gate and the drain may be reduced sufficiently.

In FIG. 2C, the active trenches 103 are formed in the active area 300 of the semiconductor substrate. An active to termination intermediate area 250 locates between the outermost active trench 103-1, which is closest to the isolation trench 102, and the isolation trench 102. In other words, the intermediate area 250 locates between the active area 300 and the terminal area 200. As shown FIG. 1 and FIG. 2C, the isolation trench 102 surrounds both the active area 300 and the interface area 250.

Figure 2D:
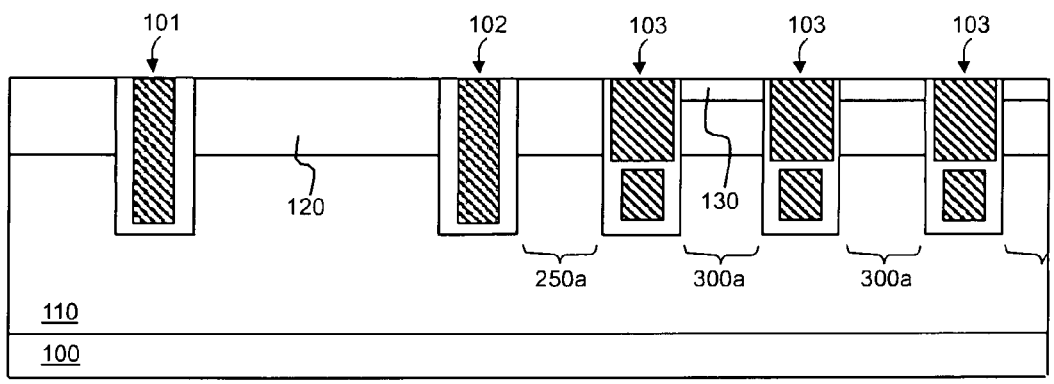

FIG. 2A to FIG. 2C illustrates an example of a method for preparing the control gate and the shielding electrode of a SGT MOSFET. But in fact, the structure of FIG. 2C may be prepared by any conventional methods. In FIG. 2D, the isolation trench 102 and the neighboring active trench 103-1 define a mesa 250a of the semiconductor substrate between them, while other neighboring active trenches 103 define a mesa 300a of the semiconductor substrate between them.

As shown in FIG. 2D, a body layer 120 is formed at the top portion of the semiconductor substrate followed by the formation of a source layer 130 at the top portion of the body layer 120 and only in the active area 300. In particularly, P-type dopants are implanted into the top portion of the epitaxial layer 110 in a blanket implant manner forming the P-type body layer 120 located at the top of the epitaxial layer 110 between two neighboring trenches with the bottom of the body layer 120 not deeper than the bottom of the control gate 103e in the epitaxial layer 110 to form a vertical inversion layer along the side wall of the active trench 103 in the body layer 120 to establish a channel; then, N+ type dopants are implanted into the top portion of the body layer 120 only in the active area 300 forming the N+ type source layer 130 at the top portion of the body layer 120 between two neighboring active trenches 103Ss shown in the figure, the source layer 130 is only formed in the mesa 300a and not formed in the mesa 250a. As well known in the art, the step of ion implantation is often accompanied with the step of anneal diffusion. In the preferred embodiment of FIG. 2D, the source layer 130 is only formed in the active area 300 and is not formed in the intermediate area 250 and the terminal area 200. However, in other embodiments, the source layer 130 may be formed in all areas of the semiconductor substrate, including active area 300, intermediate area 250 and the termination area 200, in a blanket implant mode at the same time without applying a source mask.

Figure 2E:
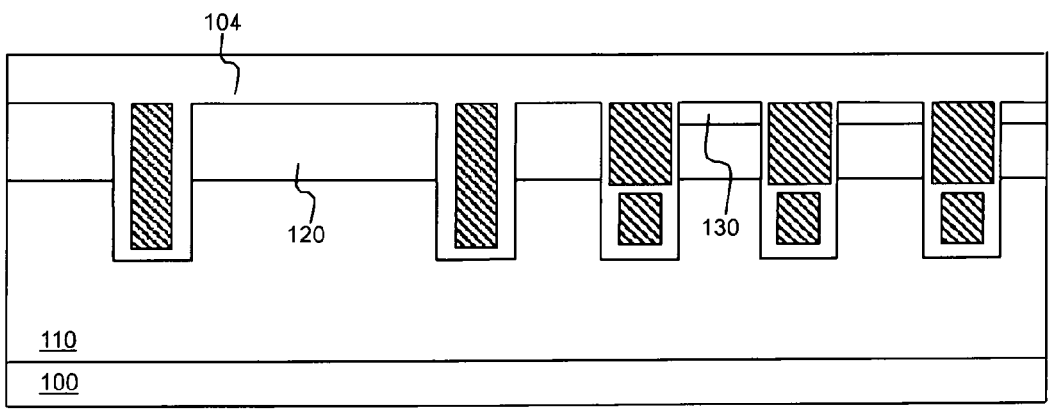
Figure 2F:
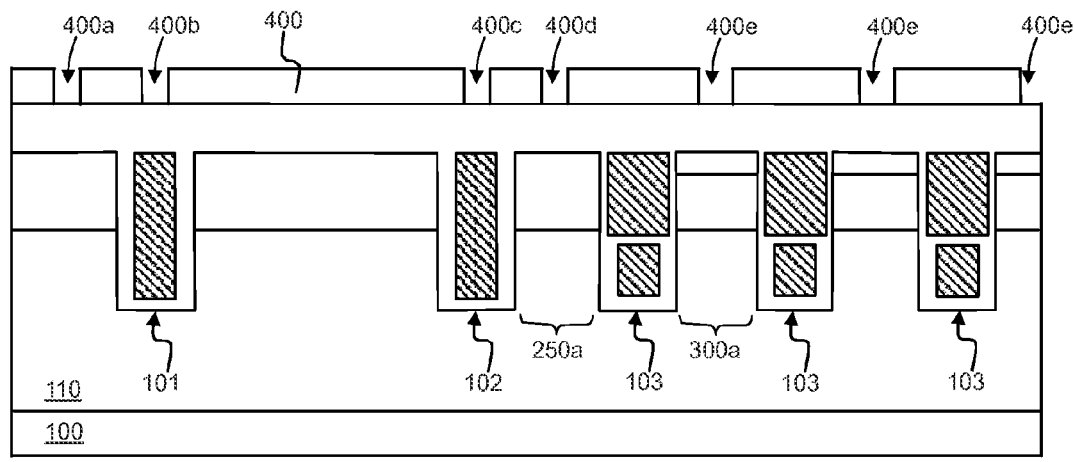

In FIG. 2E, an insulation passivation layer 140 is deposited above the semiconductor substrate to cover the upper surface of the epitaxial layer 110 as well as the termination trench 101, the isolation trench 102 and active trenches 103. The insulation passivation layer 140 may be a low-temperature oxide (LTO) and/or boron phosphate silicate glass (BPSG) layer. In FIG. 2F, a contact mask 400 is applied covering the insulation passivation layer 140. The openings 400a-400e on the mask 400 may be formed, for example, by exposing and developing a photoresist layer using existing photolithography. The openings 400a-400e are aligned atop the semiconductor substrate as follows: the opening 400a is in alignment with the body layer 120 outside the termination trench 101 of the terminal area 200, the opening 400b is in alignment with a conductive material 101a filled in the termination trench 101, the opening 400c is in alignment with a conductive material 102a filled in the isolation trench 102, the opening 400d is in alignment with the mesa 250a, and the opening 400e is in alignment with the mesa 300a, where the opening 400e is wider than the opening 400d. In addition, other openings with other functions in the mask 400 are not shown, for example the one in alignment with the gate material filled in a gate pickup trench (not shown).

Figure 2G:
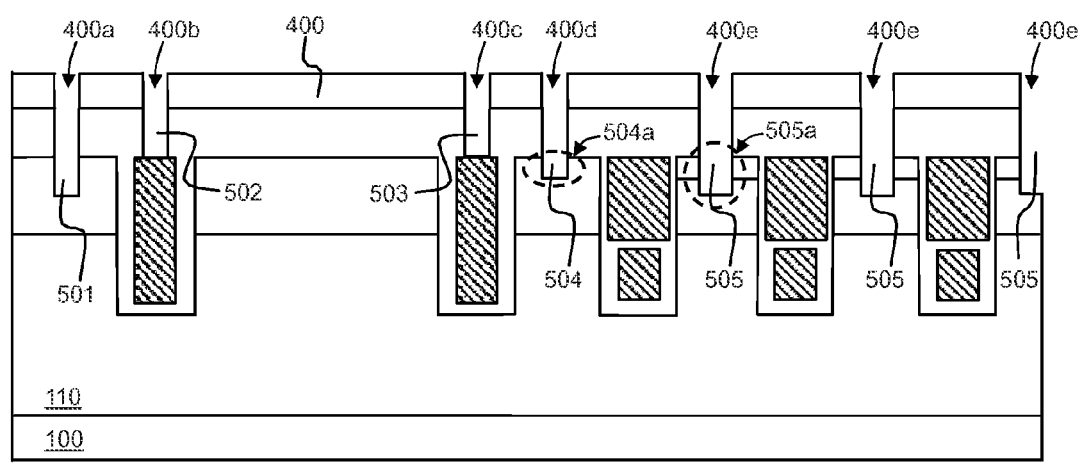

In FIG. 2G, the insulation passivation layer 140, the source layer 130 and the body layer 120 are etched downward through the openings in the mask 400 via an anisotropic dry etching to form the contact holes, in which a contact hole 504 in alignment with the mesa 250a in the intermediate area is formed by etching through the opening 400d and a contact hole 505 in alignment with the mesa 300a in the active area is formed by etching through the opening 400e.

The contact hole 504 penetrates through the insulation passivation layer 140 and ends in the body layer of the mesa 250a. The contact hole 505 penetrates through the insulation passivation layer 140 and the source layer 130 and ends in the body layer 120 of the mesa 300a. As the opening 400e is wider than the opening 400d, the etching speed of the material exposed below the opening 400e is faster than that of the material below the opening 400d, thus the contact hole 505 is wider and deeper than the contact hole 504. As shown in FIG. 2G, the part 505a of the contact hole 505 formed in the semiconductor substrate is deeper than the part 504a of the contact hole 504 formed in the semiconductor substrate.

In the etching step of FIG. 2G, the contact hole 501, the contact hole 502 and the contact hole 503 are also formed. The contact hole 501 is formed by etching through the opening 400a, the contact hole 502 is formed by etching through the opening 400b, and the contact hole 503 is formed by etching through the opening 400c. The contact hole 501 penetrates through the insulation passivation layer 140 and ends in the body layer 120 in the termination area 200 outside the termination trench 101. If the source layer 130 is formed at the top of the body layer 120 in the termination area 200, the contact hole 501 also penetrates through the source layer 130. In addition, the contact hole 502 penetrates through the insulation passivation layer 140 and ends at the top of the conductive material 101a filled in the termination trench 101, and the contact hole 503 penetrates through the insulation passivation layer 140 and ends at the top of the conductive material 102a filled in the isolation trench 102.

Figure 2H:
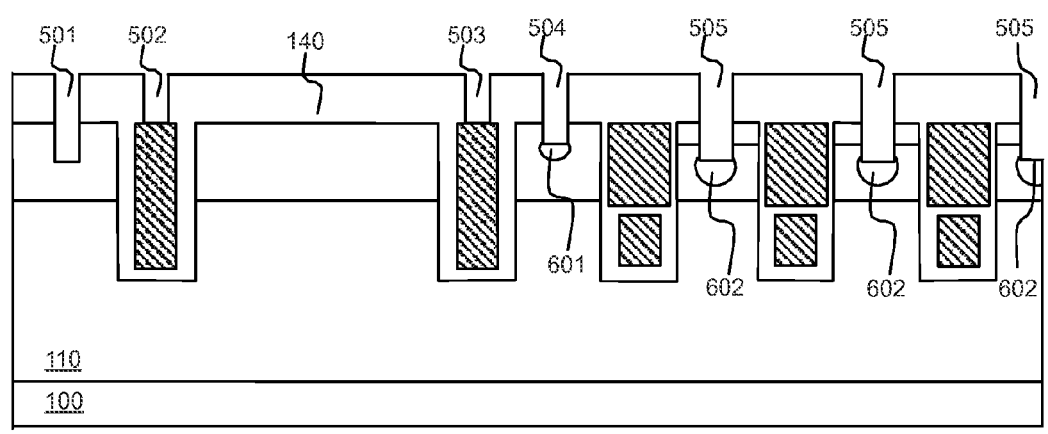
Figure 2I:
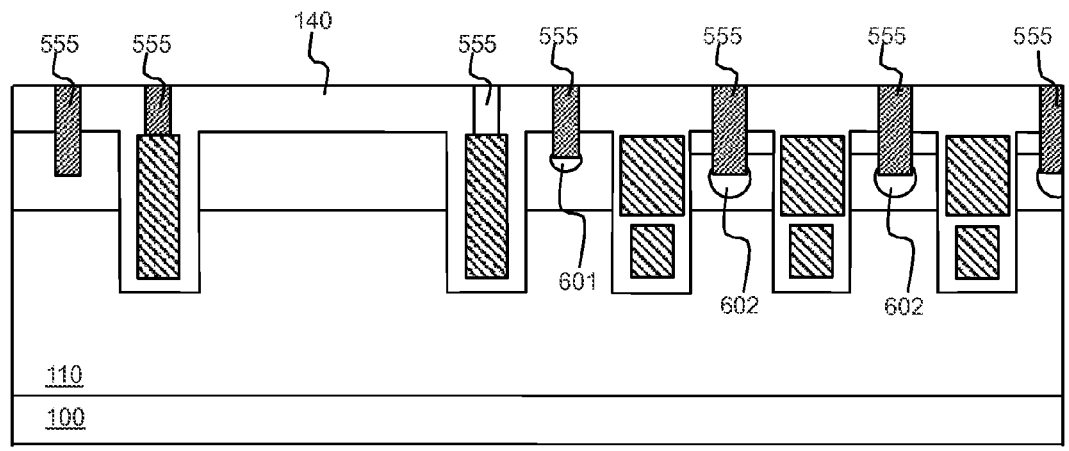

In FIG. 2H, body contact implants are formed at the bottom of the contact holes locating in the active area and the intermediate area. In this step, the implantation of the dopants is a self-alignment process. The implanted dopants must have the same conductive type as the body layer 120, i.e., P-type, but the doping concentration of the body contact implant is higher than that of the body layer. A body contact implant 601 is formed at the bottom of the contact hole 504 inside the body layer 120 in the mesa 250a of the intermediate area 250. A body contact implant 602 is formed at the bottom contact hole 500 inside the body layer 120 in the mesa 300a of the active area 300. An anneal diffusion step is performed after the implantation step. The contact hole 505 is wider than the contact hole 504, as such the body contact implant 602 is larger and deeper than that of the body contact implant 601 due to more dopants implanted and diffused in the body contact implant 602. In FIG. 2I, a thin barrier metal layer (not shown) is firstly deposited on the bottoms and the side walls of the contact holes 501-505 and the upper surface of the insulation passivation layer 140, then a metal material (such as tungsten) is filled into the contact holes 501-505. the metal materials on the top surface of the insulation passivation layer 140 is removed, thus the barrier metal layers and the metal materials in contact holes 501-505 form metal plugs 555.

Figure 2J:
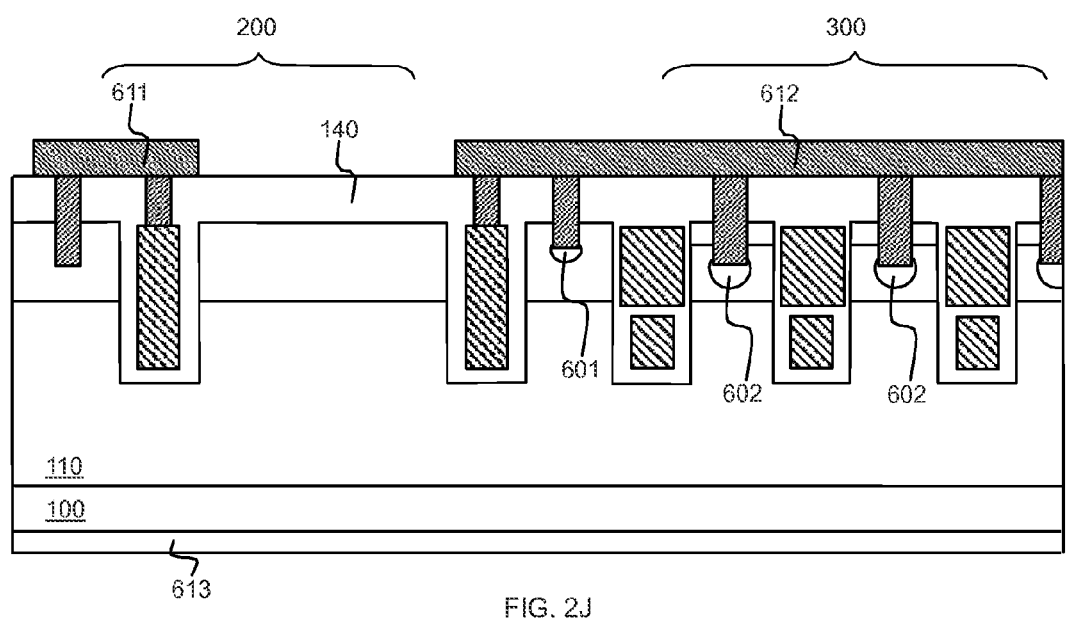

In FIG. 2J, a metal layer is deposited atop the insulation passivation layer 140, which also covers the barrier metal layer previously deposited on the upper surface of the insulation passivation layer 140, and is patterned to form metal field plate 611 and a top metal electrode 612, which are separated and electrically isolated from each other. In addition, a back metal layer 613 is deposited at and electrically contact with the back surface of the heavily doped bottom substrate 100. The field plate 611 arranged in the termination area 200 is in electric contact with the metal plug 555 in the contact hole 501 and the metal plug 555 in the contact hole 502. Therefore, the body layer 120 around the termination trench 101 and in the termination area 200 and the conductive material 101a filled in the termination trench 101 are in electrical contact with each other and at the same potential. If the source layer 130 is implanted into the top of the body layer 120 around the termination trench 101, it is also in electrical contact with the metal plug 555 in the contact hole 501 and is at the same potential with the conductive material 101a in the termination trench 101. The termination trench 101 is used as a channel stop structure.

In addition, the top metal electrode 612 arranged in the intermediate area 250 and the active area 300 above the isolation trench 102 is in electrical contact with the conductive material 102a filled in the isolation trench 102 via the metal plug 555 in the contact hole 503 and with the body layer 120 in the intermediate area 250 via the metal plug 555 in the contact hole 504. Moreover, the source layer 130 and the body layer 120 in the active area 300 are shorted together and are electrically connected with the top metal electrode 612 via metal plug 555. The shielding electrode 103a at the lower part of each active trench 103 is electrically connected with the conductive material 102a filled in the isolation trench 102 in a third dimension (not shown), and thus electrically connected with the top metal electrode 612, while the control gate 103e at the upper part of all active trenches 103 is electrically isolated from the conductive materials 102a filled in the isolation trench 102. The control gates 103e at the upper part of all active trenches 103 are connected with each other and to the gate materials filled in the gate pickup trench in a third dimension (not shown), which is electrically connected to a gate metal via a metal plug formed in the contact hole aligned with the gate materials filled in the gate pick trench, and therefore the control gates 103e are electrically connected the gate metal formed atop the insulation passivation layer 101 (not shown).

The top metal electrode 612 is used as the source electrode of the MOSFET device and the bottom metal electrode 613 is used as the drain electrode of the MOSFET device. The body layer 120 in the intermediate area and the active area, the source layer 130 in the active area 300, the shielding electrode 103a and the conductive material 102a filled in the isolation trench 102 are at the same potential with the source (if the source layer 130 is also formed in the intermediate area, it is also at the source potential.

Figure 3A:
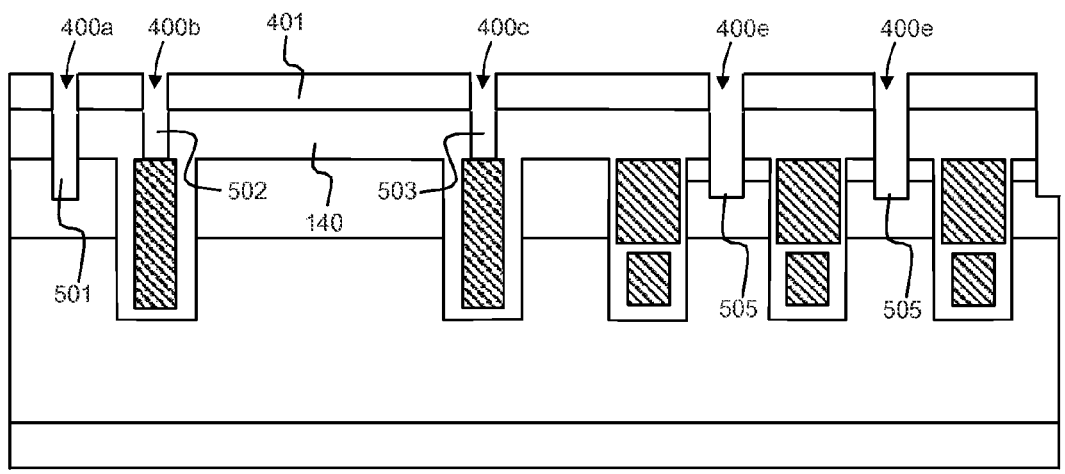
FIG. 3A to FIG. 3B are cross-sectional diagrams illustrating the alternative steps of preparing contact holes in different depths and widths by two masks.
Figure 3B:
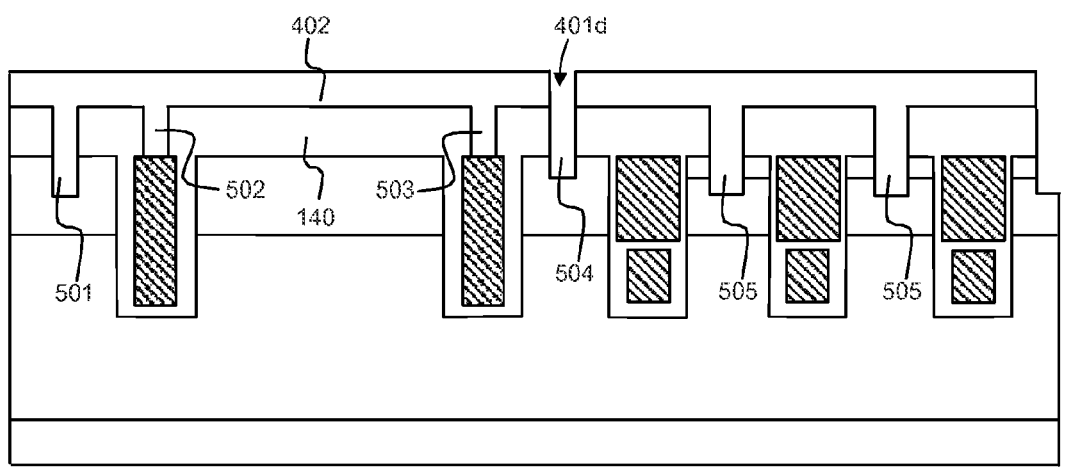

In an alternative embodiment shown in FIG. 3A and FIG. 3B, the opening 400d is formed a different mask. For example, the openings 400a, 400b, 400c and 400e in the first mask 401 are formed on the first mask 401 applied firstly on the insulation passivation layer. The insulation layer 140 and the semiconductor substrate located are etched through the opening 400a, the opening 400b, the opening 400c and the opening 400e to form the contact hole 501, the contact hole 502, the contact hole 503 and the contact hole 505 respectively, and then the first mask 400 is stripped. Another second mask 402 including the opening 400d is then applied on the insulation passivation layer 140. The insulation layer 140 and the semiconductor substrate are etched through the opening 400d to form the contact hole 504. The features of the contact holes 501-505 are the same as described above In another alternative embodiment (not shown), the opening 400a, the opening 400b, the opening 400c and the opening 400d are firstly formed in a first mask 401 for preparing the contact hole 501, the contact hole 502, the contact hole 503 and the contact hole 504, and the first mask 401 is stripped. And then the opening 400e is formed in a second mask 402 for preparing the contact hole 505.

Optionally, the opening 400a, the opening 400b and the opening 400c are not formed in the first mask 401 but in the second mask 402. In particularly, the opening 400e is firstly formed in the first mask 401, and the first mask 401 is stripped after the contact hole 505 is formed. And then the opening 400a, the opening 400b, the opening 400c and the opening 400d are formed in the second mask 402 for preparing the contact hole 501, the contact hole 502, the contact hole 503 and the contact hole 504. Alternatively, the opening 400d is firstly formed in the first mask 401, and the first mask 401 is stripped after the contact hole 504 is prepared. And then the opening 400a, the opening 400b, the opening 400c and the opening 400e are formed in the second mask 402 for preparing the contact hole 501, the contact hole 502, the contact hole 503 and the contact hole 505.

Figure 4A:
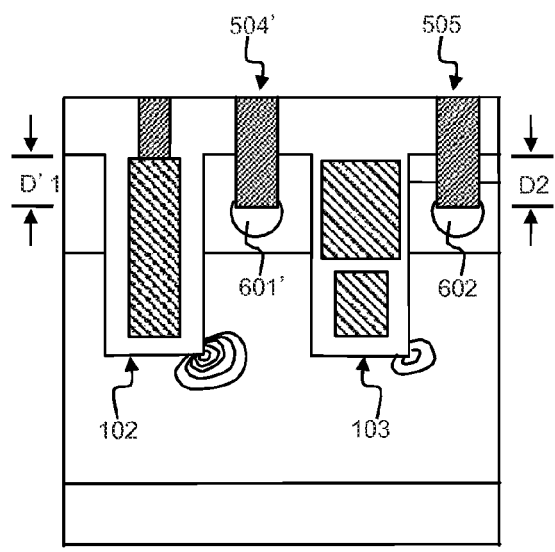
FIG. 4A is cross-sectional diagram showing the electric field intensity close to the corner of the isolation trench in the condition that the contact hole formed in the intermediate area is as wide and deep as the contact hole formed in the active area.
Figure 4B:
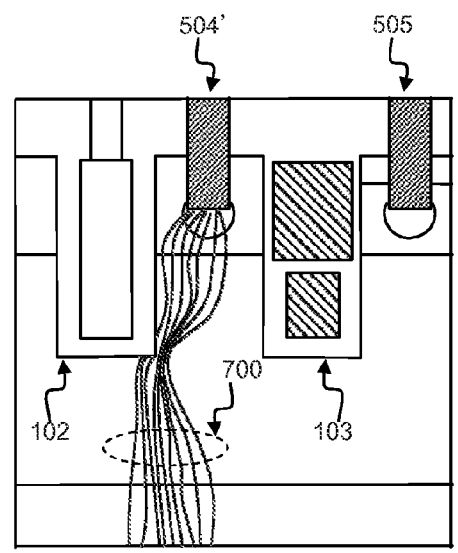
FIG. 4B is cross-sectional diagram showing the direction of an avalanche current when the avalanche breakdown occurs at the corner of the isolation trench in the intermediate area in the structure in FIG. 4A.
Figure 5A:
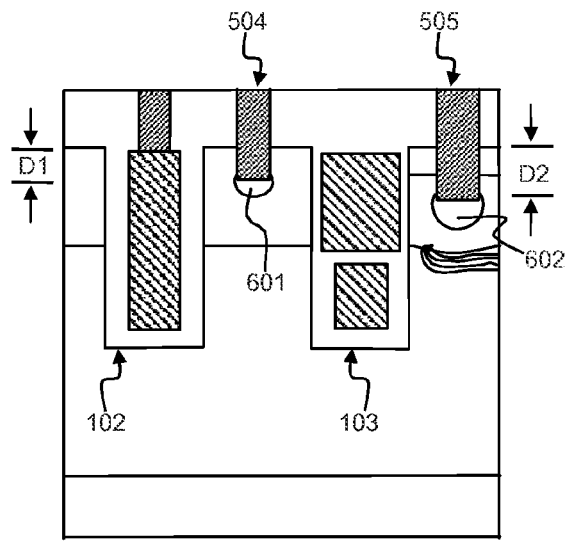
FIG. 5A is cross-sectional diagram showing the highest electric field intensity under the contact in active area in the condition that the contact hole formed in the intermediate area is narrower and shallower than the contact hole formed in the active area.
Figure 5B:
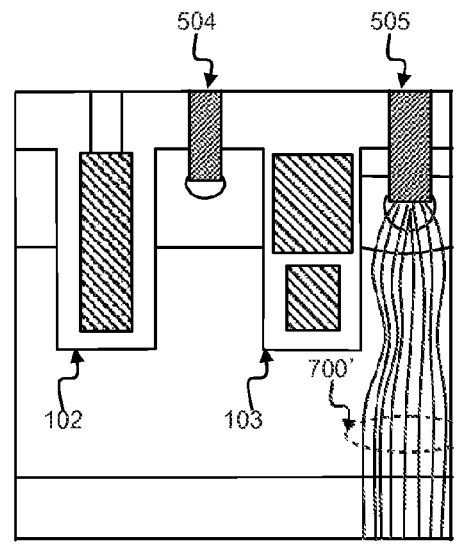
FIG. 5B is cross-sectional diagram showing the direction of the avalanche current when the avalanche breakdown occurs under the contact in active area in the structure in FIG. 5A.

In FIG. 4A, which is a cross-sectional view of a portion of the prior art SGT MOSFET, a depth D'1 of a contact hole 504' extending into the mesa 250a and a depth D2 of the contact hole 505 extending into the mesa 300a are equal. In the UIS application, the potential at the bottom metal electrode 613 is higher than that at the top metal electrode 612, in particular, the device is in the UIS event. As shown in FIG. 4A, the electric field intensity is crowded at the corners of the bottoms of the isolation trench 102 and the active trenches 103. The electric field intensity at the corner of the bottom of the isolation trench 102 is much higher than that at a PN junction between the P– body layer 120 and the N– epitaxial layer 110 in the active area 300 and is also higher than that at the corner of the bottom of the active trench 103. The breakdown voltage in the intermediate area 250 is lower than that of the active area 300. The high-voltage avalanche breakdown will occur in the position of the high electric field intensity at the corner of the bottom of the isolation trench 102 as shown in FIG. 4A, an avalanche current will flow into the intermediate area 250, e.g., in the direction of the avalanche current 700 close to the corner of the bottom of the isolation trench 102 as shown in FIG. 4B, so as to weaken the avalanche tolerance of the device. In the UIS event, it is difficult to dispose the power loss due to the limited area of the intermediate area, which severely affects the SOA of the device. In FIG. 5A, which is a cross-sectional view of a portion of SGT MOSFET of the present invention, a depth D1 of the contact hole 504 extending into the mesa 250a is shorter that a depth D2 of the contact hole 505 extending into the mesa 300a. In the body layer 120, the volume and the depth of the body contact implant 601 around the bottom of the contact hole 504 are smaller than that of the body contact area 602 around the bottom of the contact hole 505. The electric field intensity at the corner of the respective bottom of the isolation trench 102 and the active trenches 103 and the electric field intensity at the PN junction between the P– body layer 120 and the N– epitaxial layer 110 of the active area 300 are different than that shown in FIG. 4A. As such, the avalanche breakdown will not occur at the corners of the bottoms of the isolation trench 102 and the active trenches 103, but instead the PN junction between the P– body layer 120 and the N– epitaxial layer 110 of the active area 300 produces the highest electric field intensity in the central position of the mesa 300a between two neighboring active trenches 103, but the electric field intensity hereof is much larger than that at the corners of the bottoms of the isolation trench 102 and the active trenches 103. So in FIG. 5A, when the device is in the period of the UIS event, the avalanche breakdown is triggered at the PN junction between the P– body layer and the N– epitaxial layer in the active area 300. FIG. 5B shows the flow trend of the avalanche current 700' generated at the PN junction between the body layer and the epitaxial layer of the active area after the high-voltage avalanche breakdown occurred. As a result, the avalanche current occurs in the larger active area 300 instead of the small intermediate area 250, which avoids hot carriers produced in the breakdown area from being captured in the insulation layer 102b, thus preventing damage to the insulation layer 102b at the bottom of the isolation trench 102. Therefore, for the avalanche current occurs in the active area, appropriate depth of the contact holes in the intermediate area and the source area and the depth of the body contact area are designed. As a result, the electric field distribution is changed so that the breakdown voltage of the power MOSFET is maximized to improve the UIS performance of the trench MOSFET.

As shown in FIG. 5A to FIG. 5B, the interface between the body layer 120 and the epitaxial layer 110 in the intermediate area (with the contact hole 504) is level, but that between the body layer 120 and the epitaxial layer 110 of the active area (with the contact hole 505) is slightly concave, which may be caused by the diffusion of the P-type dopant of the body contact implant 602. Furthermore, the P-type dopant in the central position between two neighboring active trenches 103 is diffused most deeply, e.g., the body layer 120 in the central position extends downward deeper. In other words, although the PN junction between the body layer and the epitaxial layer of the intermediate area is still parallel to the plane of the semiconductor substrate, but the PN junction between the body layer and the epitaxial layer of the active area is not parallel to the plane of the semiconductor substrate, and instead, its outline is concave, so that the electric field is easier to accumulate here and thus the UIS avalanche will be guaranteed to triggered first under the contact in the active area, instead of trench corners or immediate area.

The above detailed descriptions are provided to illustrate specific embodiments of the present invention and are not intended to be limiting. Numerous modifications and variations within the scope of the present invention are possible. The present invention is defined by the appended claims.

What is claimed is:
1. A trench type power semiconductor device comprising:
a semiconductor substrate comprising a bottom substrate and an epitaxial layer atop the bottom substrate;
an isolation trench formed a termination area in the epitaxial layer and active trenches formed in an active area in the epitaxial layer, wherein an intermediate area locates between an outermost active trench close to the isolation trench and the isolation trench;
an insulation layer lined at bottoms and on side walls of the isolation trench and the active trenches, and conductive material deposited in the isolation trench and in the active trenches;
an insulation passivation layer covering the semiconductor substrate;
a first contact hole passing through the insulation passivation layer and extending downward into a mesa of the active area, and a second contact hole passing through the insulation passivation layer and extending downward into a mesa of the intermediate area; wherein
the first contact hole is deeper and wider than the second contact hole.

2. The trench type power semiconductor device of claim 1 further comprises first, second and third metal plugs, wherein the first and second metal plugs respective formed in the first contact hole and the second contact hole, the third metal plug formed in a third hole through the insulation passivation layer and in alignment with the conductive material deposited in the isolation trench, wherein the first, second and third metal plugs are in electrical contact with a top metal electrodes in the active area and the intermediate area.

3. The trench type power semiconductor device of claim 1, wherein the semiconductor substrate has a first conductive type, a body layer of a second conductive type opposite to the first conductivity type is formed atop the epitaxial layer, a source layer of the first conductivity type is formed at a top portion of the body layer in the active area, wherein the first contact hole and the second contact hole end in the body layer.

4. The trench type power semiconductor device of claim 3 further comprising body contact implants of the second conductivity type formed around bottoms of the first contact hole and the second contact hole wherein a depth and a diffusion range of the body contact implant around the bottom of the second contact hole are smaller than a depth and a diffusion range of the body contact implant around the bottom of the first contact hole respectively.

5. The trench type power semiconductor device of claim 1, wherein the conductive material in each of the active trenches comprise a shielding gate located at a lower part of the active trench and a control gate located at an upper part of the active trench, and an insulation layer is arranged between the shielding gate and the contact gate, and wherein the shielding gate and the conductive material in the isolation trench have the same potential.

6. A trench type power semiconductor device comprising:
a semiconductor substrate comprising a bottom substrate and an epitaxial layer atop the bottom substrate;
a first mesa formed between a first trench and a second trench extending from a top surface of the epitaxial layer into the epitaxial layer;
a second mesa formed between a third trench and the second trench from the top surface of the epitaxial layer into the epitaxial layer;
a source region having a conductivity type same as the epitaxial layer formed from the top surface of the epitaxial layer to a first depth in the first mesa, the source region extending through an entire width of the first mesa;

a first body region having a conductivity type opposite the epitaxial layer formed in the first mesa from a bottom of the source region to a second depth deeper than the first depth, the first body region extending through the entire width of the first mesa;

a second body region formed in the second mesa from the top surface of the epitaxial layer to a third depth, the second body region extending through an entire width of the second mesa;

a first contact hole filled with a conductive material formed from the top surface of the epitaxial layer through the source region reaching the first body region;

a second contact hole filled with a conductive material formed from the top surface of the epitaxial layer into the second body region, wherein the second contact hole being narrower and shallower than the first contact hole.

7. The trench type power semiconductor device of claim 6, wherein the first and second trenches being filled with a conductive material insulated from the epitaxial layer functioning as trenched gate.

8. The trench type power semiconductor device of claim 7, wherein the third trench being filled with a conductive material insulated from the epitaxial layer functioning as a gate runner.

9. The trench type power semiconductor device of claim 6, wherein the third depth of the second body region being substantially the same as the second depth of the first body region.

10. The trench type power semiconductor device of claim 9 further comprising a body type doped region more heavily doped than the first body region at a bottom of the first contact hole.

11. The trench type power semiconductor device of claim 10 further comprising a body type doped region more heavily doped than the second body region at a bottom of the second contact hole.

12. The trench type power semiconductor device of claim 6 wherein the first trench and the second trench being enclosed by the third trench.

13. The trench type power semiconductor device of claim 6 the conductive material filling the first contact hole being electrically connected to the conductive material filling the second contact hole.

14. The trench type power semiconductor device of claim 6, wherein the third trench being filled with a conductive material insulated from the epitaxial layer.

15. The trench type power semiconductor device of claim 14 further comprising a third contact hole open through a dielectric material on top of the conductive material inside the third trench, wherein the third contact hole being filled with a conductive material connected to the conductive material filling the third trench.

* * * * *